US006933199B1

(12) United States Patent
Wong et al.

(10) Patent No.: US 6,933,199 B1
(45) Date of Patent: Aug. 23, 2005

(54) METHOD FOR INTEGRATING NON-VOLATILE MEMORY WITH HIGH-VOLTAGE AND LOW-VOLTAGE LOGIC IN A SALICIDE PROCESS

(75) Inventors: Jack Wong, Phoenix, AZ (US); Sonu Daryanani, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 41 days.

(21) Appl. No.: 10/685,629

(22) Filed: Oct. 15, 2003

(51) Int. Cl.[7] .......................................... H01L 21/8234
(52) U.S. Cl. ....................................... 438/275; 438/279
(58) Field of Search ................................. 438/275, 279

(56) References Cited

U.S. PATENT DOCUMENTS

| 5,879,990 A | 3/1999 | Dormans et al. ............ 438/257 |
| 5,956,584 A | 9/1999 | Wu .............................. 438/232 |
| 6,251,728 B1 | 6/2001 | Patelmo et al. ............. 438/257 |

FOREIGN PATENT DOCUMENTS

EP         0 811 983 A1   10/1997   ........... G11C 11/34

OTHER PUBLICATIONS

Wong, Jack and Daryanani, Sonu, *Method of Forming High Voltage CMOS Transistors Using a Modified SADS Process*, Microchip Technology, Inc., Tempe, AZ.

Primary Examiner—Long Pham
(74) Attorney, Agent, or Firm—Baker Botts L.L.P.

(57) ABSTRACT

A method for integrating non-volatile memory with high-voltage and low-voltage logic in a salicide process is disclosed. The method includes forming a source region and a drain region associated with a gate region for each of a low-voltage (LV) device, a high-voltage (HV) device and a non-volatile memory (NVM) device. The HV, LV and NVM devices are electrically isolated by a field oxide region located adjacent to the respective source and drain regions. The field oxide regions are implanted with an isolation implant, such that the field implant is spaced a predetermined distance away from the HV and NVM source and drain regions. A blanking layer is deposited on the field oxide regions and a portion of the source and drain regions associated with the HV and NVM devices. Doped metal salicide regions are formed on the LV source and drain regions, all gate regions, and the exposed portions of the HV and NVM source and drain regions not covered by the blanking layer.

17 Claims, 5 Drawing Sheets

METHOD FOR INTEGRATING NON-VOLATILE MEMORY WITH HIGH-VOLTAGE AND LOW-VOLTAGE LOGIC IN A SALICIDE PROCESS

FIELD OF THE INVENTION

The present invention relates generally to high-voltage MOSFETs, and more particularly to a method for integrating non-volatile memory with high-voltage and low-voltage logic in a salicide process.

BACKGROUND OF THE INVENTION TECHNOLOGY

EEPROM (Electrically Erasable Programmable Read Only Memory) cells are a class of nonvolatile semiconductor memory in which information may be electrically programmed into and erased from each memory element or cell. Floating gate EEPROM cells are one type of EEPROM cell in which information is stored by placing electronic charge on a "floating gate," typically a region of conductive polysilicon that is electrically isolated from other conducting regions of the device by insulating dielectric layers that surround it. The charge on the floating gate can be detected when reading the memory cell because the charge changes the threshold voltage of the memory transistor. This change in threshold voltage varies the amount of current that flows through the cell when voltages are applied to the cell during the read operation and the current can be detected by a sense amplifier circuit.

One technique often used in advanced process to create EEPROM devices having gate and junction regions with reduced resistivities is a salicide process. The salicide process uses a layer of self-aligned silicide ("salicide"), which reduces the resistivity of the gate and junction regions of a device. A silicide layer is obtained by depositing titanium, or another transition metal, on the entire surface of the device, and applying a heat treatment that causes the titanium to react with the underlying silicon in the gate and junction regions to form a titanium silicide layer. Subsequently, the non-reacted titanium deposited on the oxide regions is removed by etching with an appropriate solution, which leaves the titanium silicide intact. Traditionally, the salicide process has been used for fabricating low voltage CMOS devices having gate widths below approximately 0.35 microns.

As geometries of the devices continue to shrink, developing an integrated process to combine low-voltage devices with high-voltage devices and non-volatile memory devices, such as EEPROMs, becomes more challenging. A conventional salicide process is typically incompatible with requirements for high-voltage devices that have shallow, lightly doped source/drain junctions because it is difficult to develop a reliable integrated fabrication process flow that combines low-voltage, high-voltage and non-volatile memory devices together in one process. The lightly doped junctions require a balance between low junction leakage and high breakdown voltage. Low junction leakage typically implies a high doping concentration, while high breakdown voltage implies a low doping concentration. Additionally, there is a tradeoff between low sheet resistance (e.g., thick salicide) and low silicon consumption for shallow junctions (e.g., thin salicide), and scaling the salicide thickness to reduce the junction leakage is typically not an option.

Due to the tradeoffs between junction leakage and high breakdown voltage, prior art solutions have not used the salicide process for devices having shallow, lightly doped junctions with high-voltage requirements. In one prior art solution, a process for fabricating a flash EEPROM involves saliciding low-voltage logic, memory cells and the source and drain regions of high-voltage devices. The fabrication process, however, does not use a salicide process to form the gate region of the high-voltage device. In another prior art solution, an EEPROM process flow salicides low-voltage devices, the source and gate regions of memory cells and the gate region of the high-voltage devices. The process flow, however, avoids saliciding the source and drain regions of the high-voltage devices and the drain diffusion regions of the memory cells since each junction is lightly doped. A further prior art solution salicides entire regions of memory and low-voltage devices. However, this solution provides no technique for saliciding high-voltage devices.

While the described prior art solutions employing a salicide process for fabrication of low-voltage, high-voltage and non-volatile memory devices are an improvement over earlier solutions, they still have several drawbacks. Accordingly, a technique to simultaneously fabricate low-voltage, high-voltage and memory devices is desired.

SUMMARY OF THE INVENTION

In accordance with teachings of the present invention, a method for integrating non-volatile memory with high-voltage and low-voltage logic in a salicide process is provided. The method includes the steps of forming a source region and a drain region associated with a gate region for each of a high-voltage (HV) device, a low-voltage (LV) device and a non-volatile memory (NVM) device. The HV, LV and NVM devices are each electrically isolated by a field oxide region located adjacent to the respective source and drain regions. The method also includes the steps of forming field implant regions under the field oxide regions, forming a blanking layer on the field oxide regions and a portion of the source and drain regions associated with the HV and NVM devices and depositing a metal layer on the gate regions, the blanking layer and exposed portions of the source and drain regions not covered by the blanking layer. The method further includes the step of forming metal salicide regions on the gate regions and the exposed portions of the source and drain regions.

In a further embodiment, the field implant region is located a first predetermined distance from an active edge of the source and drain regions. In this embodiment, the metal salicide regions associated with the exposed portions of the source and drain regions are located a second predetermined distance from the edge of the source and drain regions.

In yet another embodiment, an integrated circuit is provided. The integrated circuit includes a source region and a drain region associated with a gate region for each of a high-voltage (HV) device, a low-voltage (LV) device and a non-volatile memory (NVM) device. The HV, LV and NVM devices are each electrically isolated by a field oxide region located adjacent to the respective source and drain regions. The integrated circuit also includes a field implant region formed underneath each of the field oxide regions and a blanking layer formed on the field oxide regions and a portion of the source and drain regions associated with the HV and NVM devices. The integrated circuit further includes a metal salicide region formed on each of the gate regions and the exposed portions of the source and drain regions associated with the HV, LV and NVM devices.

In one aspect, the present invention provides the technical advantage of integrating a non-volatile memory with high-voltage and low-voltage logic in a salicide process.

In another aspect, the present invention provides the technical advantage of maintaining high junction breakdown voltages and low leakage for high-voltage and non-volatile memory devices while also providing low junction resistivity for all devices forming an integrated circuit.

In a further aspect, the present invention provides the technical advantage of preventing a dopant species from forming a compound with a metal salicide layer by implanting the dopant species between two anneal steps such that the dopant species is driven out after the second anneal.

Features and advantages of the invention will be apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings, wherein.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the following discussion and FIGS. 1 through 9, the details of exemplary embodiments of the present invention are illustrated. Like elements in the drawings will be represented by like numbers.

Today, integrated circuits include numerous types of semiconductor devices that perform various required functions in order for the integrated circuit to operate properly. In some cases, the devices have different characteristics that require specific processing steps during fabrication. For example, some devices require low gate and junction resistivity. The resistivity of the gate and junction regions may be reduced by fabricating the devices using a salicide process. Conventional salicide processes, however, typically cannot be used to fabricate high-voltage and non-volatile memory devices, such as EEPROMs (Electrically Erasable Programmable Read Only Memory), because these devices should have shallow, lightly doped source/drain junctions in order to maintain high breakdown voltages.

The present invention solves the difficulties present in prior art solutions by including a blanking layer in the integrated circuit to protect the active edges of the source and drain junctions associated with the high-voltage and non-volatile memory devices during a salicide process. Additionally, the present invention uses a field oxide with a field implant region to electrically isolate the high-voltage and non-volatile memory devices. The field implant region is spaced a predetermined distance from the edges of the junction regions and is only formed under a narrow portion of field oxide separating the devices. By employing one or both of the blanking layer and the narrow implant regions during the salicide process, the high-voltage and non-volatile memory devices may include a salicide layer and still maintain a balance between low junction leakage and high breakdown voltage as required by the lightly doped junctions.

Figure 1:
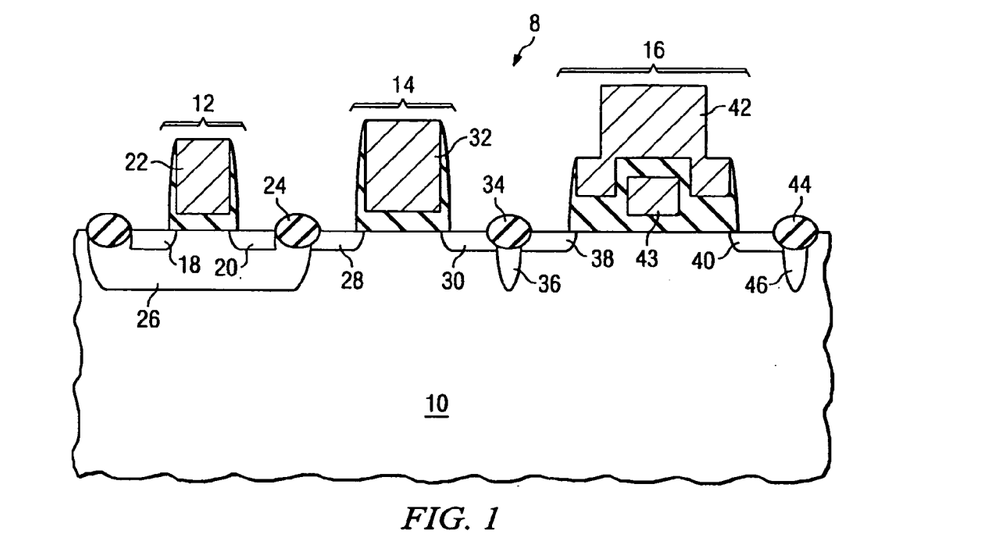
FIG. 1 illustrates a cross-sectional view of an example embodiment of an integrated circuit including a low-voltage, a high-voltage and a non-volatile memory device according to teachings of the present invention.

Referring now to FIG. 1, a cross-sectional view of integrated circuit 8 that includes low-voltage (LV) device 12, high-voltage (HV) device 14 and non-volatile memory (NVM) device 16 formed in well/substrate 10 is depicted. Well/substrate 10 may be doped with p-type impurities or n-type impurities.

LV device 12 may be a p-type or n-type device that includes LV source region 18, LV drain region 20 and LV gate region 22. Field oxide region 24 may be located adjacent to LV source region 18 and/or LV drain region 20 and may separate LV device 12 from adjacent devices. LV implant region 26 is located in well/substrate 10 under LV device 12 and a portion of field oxide region 24, and serves as the well implant for LV device 12 as well as the field implant for field oxide region 24 to isolate LV device 12 electrically from other devices. LV implant region 26 may be doped with either p-type or n-type impurities.

High-voltage device 14 may be a p-type or n-type device that 14 includes HV source region 28, HV drain region 30 and HV gate region 32. HV source region 28 and HV drain region 30 may be shallow, lightly doped junctions that enable HV device 14 to have a high breakdown voltage. Field oxide region 34 may be located adjacent HV source region 28 and/or HV drain region 30. HV implant region 36 is located under field oxide region 34 and serves to isolate HV device 14 electrically from other devices. Similar to LV implant region 26, HV implant region 36 may be doped with either p-type or n-type impurities. In the illustrated embodiment, HV implant region 36 is confined to a narrow region under field oxide region 34 and is spaced a predetermined distance from the active edge of HV drain region 30. Additionally, LV implant region 26 may be spaced a predetermined distance from the active edge of HV source region 28. By spacing LV implant region 26 and HV implant region 36 away from the respective edges of HV source region 28 and HV drain region 30, a high junction breakdown voltage may be maintained for HV device 14.

Non-volatile device 14 may be a flash memory device, a programmable read-only memory (PROM), an erasable programmable read-only memory (EPROM), an electronically erasable programmable read-only memory (EEPROM) or any suitable selection and/or array of non-volatile memory that retains data after power to a computer (not expressly shown) including integrated circuit 8 is discontinued. Non-volatile device 16 includes NVM source region 38, NVM drain region 40, NVM gate region 42 and NVM floating gate region 43, where NVM source region 38 and NVM drain region 40 are doped with either p-type or n-type impurities. NVM source region 38 and NVM drain region 40 may be shallow, lightly doped junctions that enable NVM device 16 to have a high breakdown voltage.

Field oxide region 44 may be located adjacent to NVM source region 38 and/or NVM drain region 40. Field oxide region 44 serves to isolate NVM device 16 electrically from any adjacent devices. NVM implant region 46 is located under field oxide region 44 and operates to electrically isolate NVM device 16 from adjacent devices. Similar to LV implant region 26 and HV implant region 36, NVM implant region 46 may be doped with either p-type or n-type impurities. In the illustrated embodiment, NVM implant region 46 is confined to a narrow region under field oxide region 44 and is spaced a predetermined distance from the active edge of NVM drain region 40. Additionally, HV implant region 36 may be spaced a predetermined distance from the active edge of NVM source region 38. As described above in reference to HV device 14, a high junction breakdown voltage may be maintained for NVM device 16 by spacing HV implant region 36 and NVM implant region 46 away from the respective edges of NVM source region 38 and NVM drain region 40.

Integrated circuit 8 may be formed by any conventional CMOS and/or NVM fabrication process. In one embodiment, field oxide regions 24, 34 and 44 are formed by a LOCOS (Local Oxidation of Silicon) process. In another embodiment, field oxide regions 24, 34 and 44 are formed by an STI process. Field oxide regions 24, 34 and 44 may be formed of silicon dioxide or any other appropriate material that functions as an insulator and separates the active edges of LV device 12, HV device 14 and NVM device 16. LV gate region 22, HV gate region 32, NVM gate region 42 and NVM floating gate region 43 may be formed of polysilicon or amorphous silicon. Each gate region may include oxide or nitride sidewall spacers to protect the sides of the gate regions from subsequent processing steps. LV source region 18, LV drain region 20, HV source region 28, HV drain region 30, NVM source region 38 and NVM drain region 40 may be lightly doped with an appropriate p-type or n-type impurity. LV implant region 26, HV implant region 36 and NVM implant region 46 may be formed by implanting an appropriate p-type or n-type impurity respectively through field oxides regions 24, 34 and 44. In one embodiment, the p-type dopant may be boron (B) or boron fluoride ($BF_2$) and the n-type dopant may be phosphorous (P) or arsenic (As).

Figure 2:
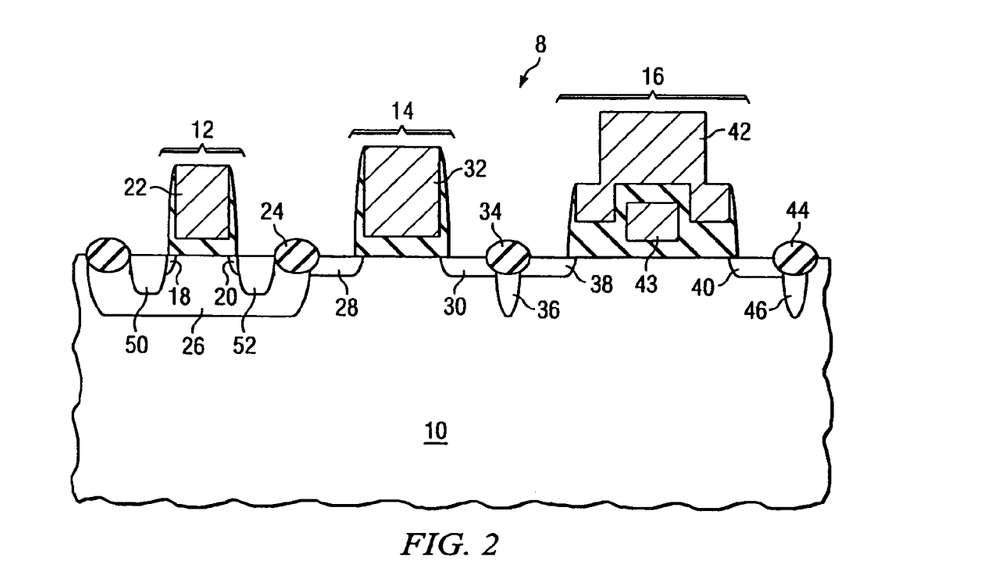
FIG. 2 illustrates the step of implanting dopants into the source and drain regions associated with the low-voltage device according to teachings of the present invention.

Referring to FIG. 2, the step of implanting a high concentration of dopants into LV source region 18 and LV drain region 20 is depicted. The doping process used to implant impurities, also known as dopants, forms doped source region 50 and doped drain region 52 for LV device 12. The impurities may be either p-type or n-type to respectively form a p-type or n-type low-voltage transistor. In one embodiment, doped source region 50 and doped drain region 52 may have a depth approximately one to two times greater than the depth of HV source region 28 and HV drain region 30.

During the doping process, HV device 14 and NVM device 16 may be protected by a resist layer or a masking layer that prevents the dopants from penetrating into HV source region 28, HV drain region 30, NVM source region 38 and NVM drain region 40. By masking HV device 14 and NVM device 16, the respective source and drain regions remain lightly doped to maintain a high junction breakdown value for both devices.

Figure 3:
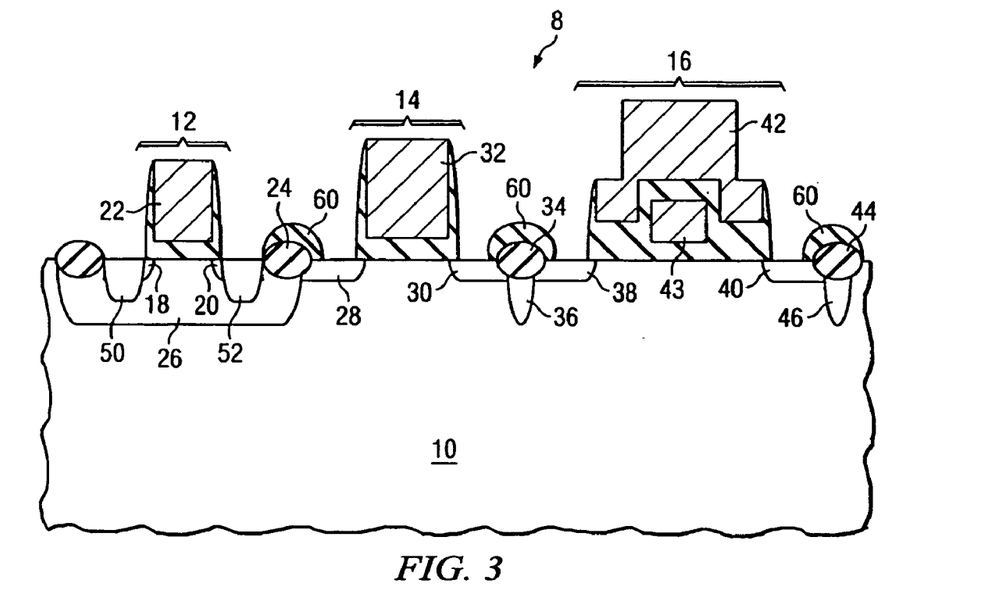
FIG. 3 illustrates the step of depositing and patterning a blanking layer on field oxide regions and portions of the source and drain regions associated with the high-voltage and non-volatile memory devices according to teachings of the present invention.

Referring to FIG. 3, the step of forming blanking layer 60 on portions of HV device 14 and NVM device 16 is depicted. Blanking layer 60 may be formed from an oxide, nitride or any other suitable material that prevents covered regions from being affected by specific processing steps in a fabrication process for LV device 12, HV device 14 and NVM device 16. Initially, blanking layer 60 may be formed on all regions of LV device 12, HV device 14 and NVM device 16. To form the illustrated embodiment, certain portions of blanking layer 60 are patterned to expose specific regions of LV device 12, HV device 14 and NVM device 16. The illustrated portions may be defined by forming a resist layer (not expressly shown) on blanking layer 60, developing areas of the resist layer that correspond to regions of blanking layer 60 that will be removed and etching exposed areas of blanking layer 60 that are not covered by the resist layer to expose regions of LV device 12, HV device 14 and NVM device 16. In the illustrated embodiment, blanking layer 60 covers field oxide regions 24, 34 and 44 and additionally overlaps field oxide regions 24, 34 and 44 such that blanking layer 60 covers a predetermined amount of HV source region 28, HV drain region 30, NVM source region 38 and NVM drain region 40. Blanking layer 60 operates to prevent subsequent processing steps from operating on the active edges of the respective source and drain regions for HV device 14 and NVM device 16.

Figure 4:
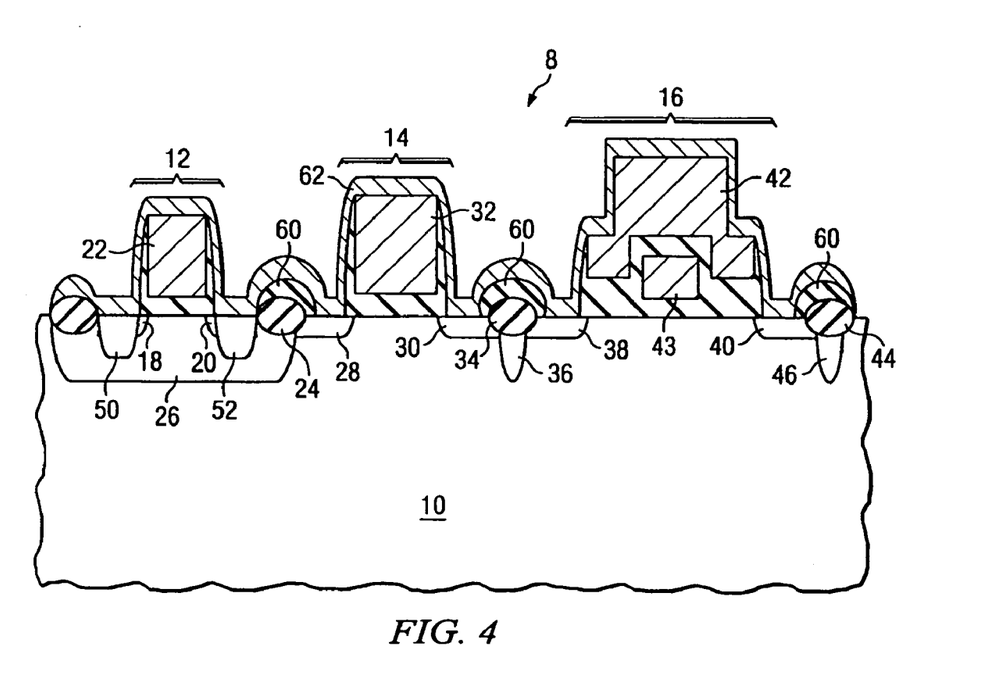
FIGS. 4–6 illustrate steps involved in a salicide process according to teachings of the present invention.
Figure 5:
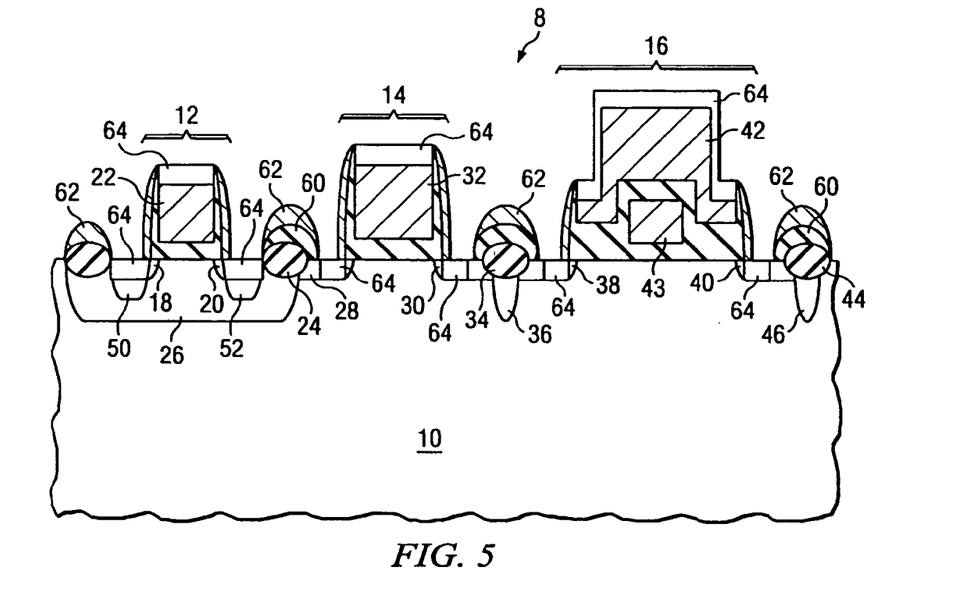
Figure 6:
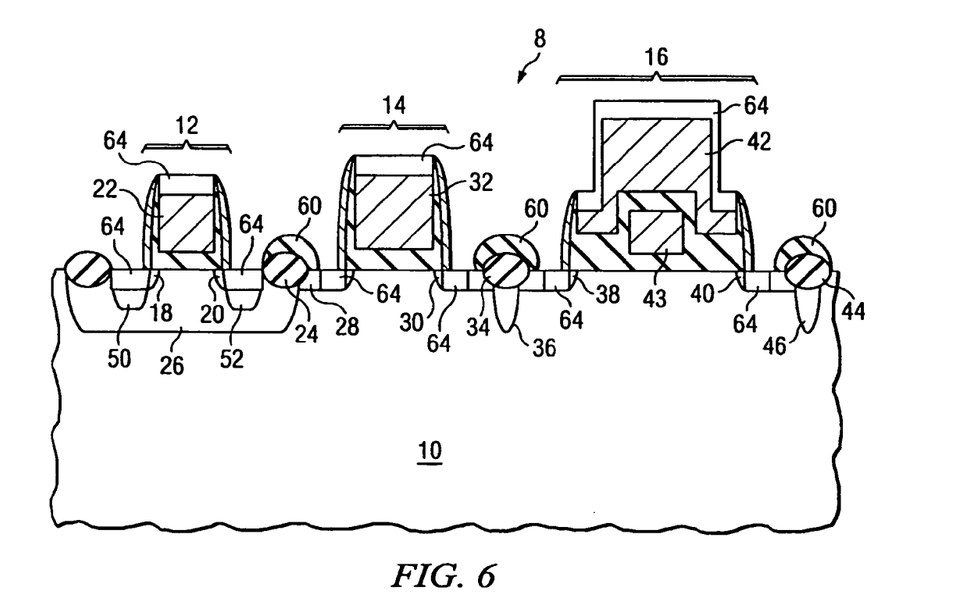

Referring now to FIGS. 4 through 6, the steps for a salicide process are depicted. In FIG. 4, metal layer 62 is formed on all regions of LV device 12, HV device 14 and NVM device 16. Metal layer 62 may be formed from titanium, cobalt, tungsten, platinum, nickel, molybdenum or any other appropriate transition metal. In one embodiment, metal layer 62 may have a substantially uniform thickness of between approximately 100 angstroms and approximately 500 angstroms.

In FIG. 5, an RTP anneal is applied to metal layer 62 in order to react metal layer 62 with any region not protected by field oxide or blanking layer 60. Specifically, the anneal causes metal layer 62 to react with doped source region 50, doped drain region 52 and LV gate region 22 associated with LV device 12 to form salicide layer 64. Metal layer 62 further reacts with HV gate region 32 and NVM gate region 42 to form salicide layer 64. Since blanking layer 60 is located over a predetermined amount of HV source region 28, HV drain region 30, NVM source region 38 and NVM drain region 40, the area under blanking layer for each of the regions does not react with metal layer 62. The exposed portion of each region, however, reacts with metal layer 62 to form salicide layer 64. The anneal forms a silicide phase, which may be high or low resistivity depending on the type of silicide used. In one embodiment, the anneal may be performed at a temperature between approximately 450° C. and approximately 800° C.

In FIG. 6, unreacted portions of metal layer 62 are removed to expose the sidewall spacers and blanking layer 60. In one embodiment, the unreacted portions of metal layer 62 may be removed with a wet chemical solution. The wet chemical solution may remove the unreacted portions of metal layer 62 while removing salicide layer 64 to a much lesser extent.

Figure 7:
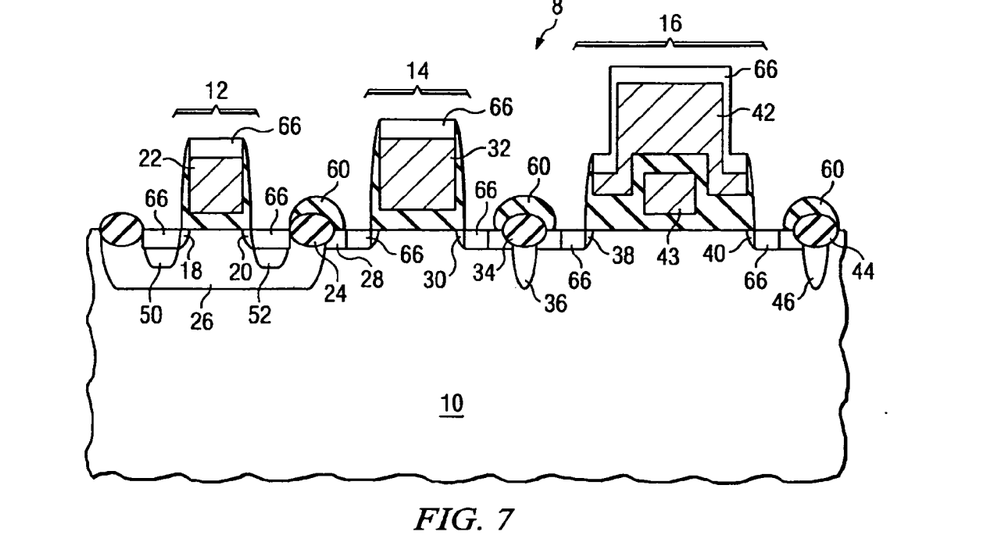
FIG. 7 illustrates the step of implanting dopants into salicided regions of the integrated circuit according to teachings of the present invention.

Referring to FIG. 7, the step of implanting dopants into salicide layer 64 to form doped salicide layer 66 is depicted. In order to reduce the junction leakage of salicide layer 64 formed in regions of LV device 12, HV device 14 and NVM device 16, salicide layer 64 may be implanted with a high dose of impurities to form doped salicide layer 66. As described above in reference to other steps, blanking layer 60 protects a predetermined area of HV source region 28, HV drain region 30, NVM source region 38 and NVM drain region 40. The portions of these regions covered by blanking layer 60 are not affected by the implant and remain lightly doped in order to maintain a high breakdown junction voltage for HV device 14 and NVM device 16. In one embodiment, the peak of the implant may be centered near the middle of the thickness of salicide layer 64. In another embodiment, the concentration of dopants may be between approximately $5e14/cm^2$ and approximately $5e15/cm^2$ such that the implanted impurities are confined in reacted metal layer 64. If LV device 12, HV device 14 and NVM device 16 are n-type devices, the implant species may be either arsenic or phosphorous. If LV device 12, HV device 14 and NVM device 16 are p-type devices, the implant species may be either B or $BF_2$.

Figure 8:
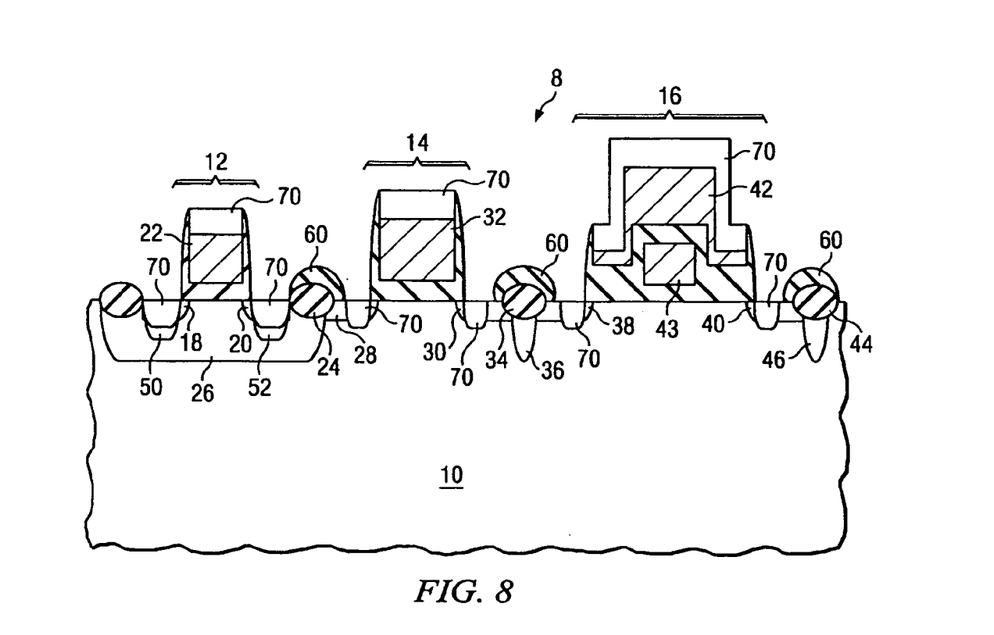
FIG. 8 illustrates the step of annealing the salicided regions of the integrated circuit according to teachings of the present invention.

Referring now to FIG. 8, the step of annealing doped salicide layer 66 to form SADS layer 70 is depicted. The technique of junction formation using salicide layer 64 as a diffusion source is referred to as Salicide As Diffusion Source (SADS). A second RTP anneal may be applied to doped salicide layer 66. The anneal operates to drive out the previously implanted impurities to form a high-concentration layer at the interface of SADS layer 70. In addition, the second RTP anneal may also serve to form a low resistivity salicide depending on the type of salicide used. In one embodiment, the anneal may be performed at a temperature of between approximately 800° C. and approximately 1000° C.

FIGS. 7 and 8 illustrate a modified SADS process. The modified SADS process prevents a compound of the dopant species and metal layer 62 from forming during the fabrication process. Additionally, the modified SADS process eliminates an additional RTP anneal step since the dopant drive out and formation of the low resistivity phase of SADS layer 70 is performed in one step. By using the modified SADS process in combination with spacing the salicide formation in HV source region 28, HV drain region 30, NVM source region 38 and NVM drain region 40 away from the active edges, the salicide interface of the respective source and drain regions of HV device 14 and NVM device 16 maintains a high dopant concentration, while the active edges of the source and drain regions remain lightly doped to maintain high breakdown voltages.

Figure 9:
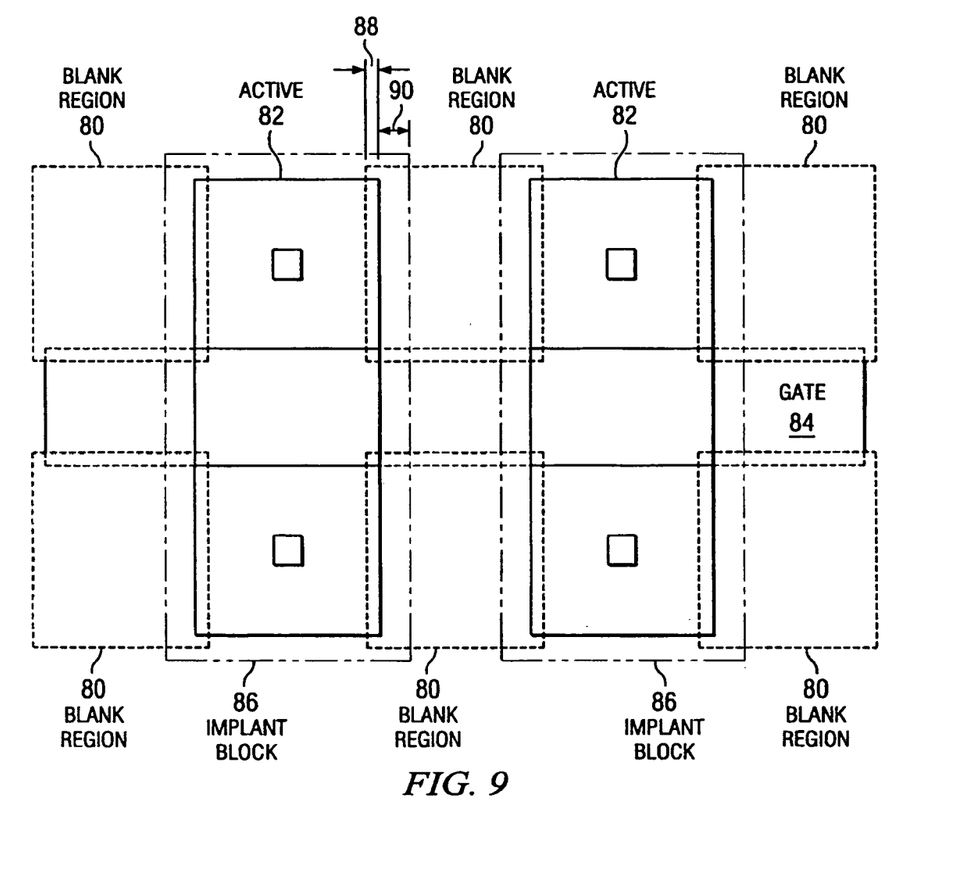
FIG. 9 illustrates a layout view of a high-voltage device including an implant region spaced a first distance from the active edge of a diffusion area and a blanking layer overlapping the active edge by a second distance according to teachings of the present invention.

Referring now to FIG. 9, a layout view of an implementation for spacing field implant regions and salicide regions away from the active area is depicted. As illustrated, a high-voltage device, such as HV device 14 shown in FIGS. 1 through 8, includes blank regions 80, active regions 82, gate region 84 and implant blocks 86. Blank regions 80 may be formed from an oxide, a nitride or any other material that prevents layers located under blank regions 80 from being affected by processing steps associated with the formation of the high-voltage device. Active regions 82 may be source and/or drain regions of the high-voltage device that are lightly doped with either p-type or n-type impurities such that a p-type or n-type HV transistor is formed. Gate region 84 may be polysilicon or amorphous silicon.

Implant blocks 86 may represent an area covered by a resist layer or a masking layer during an implant step of a fabrication process. Implant blocks 86 operate to protect active regions 82 during the field implant step such that each region remains lightly doped. Implant blocks 86 overlap the active edges of active regions 82 by implant distance 90 in order to form a narrow strip for the implant. Implant distance 90 may vary depending on the design rules associated with the fabrication process used to form the high-voltage device. During the field implant step, the underlying substrate in between implant blocks 82 will be doped with either p-type or n-type impurities such that implant regions are formed. The implant regions are located a distance approximately equal to implant distance 90 from the edges of active regions 82 and operate to electrically isolate adjacent devices from one another. By spacing the field implant away from the edges of active regions 82, the high-voltage devices maintain high breakdown voltages.

Blank regions 80 may cover an underlying layer of field oxide (not expressly shown). In the illustrated embodiment, blank regions 80 overlap active regions 82 by active distance 88 such that a portion of active regions 82 are covered by blank regions 80. Active distance 88 may vary depending on the design rules associated with the fabrication process used to form a high-voltage device. During a salicide process (e.g., as described above in reference to FIGS. 4 through 6) and a SADS process (e.g., as described above in reference to FIGS. 7 and 8), blank regions 80 prevent portions of active regions 82, which have a width approximately equal to active distance 88, from being affected by the processing steps. For example, during the salicide process, blank regions 80 prevent the covered portions of active regions 82 from being affected by an anneal such that only the exposed portions of active regions 82 react with a deposited metal layer to form a salicide layer. Blank regions 80 further prevent impurities from being implanted into portions of active regions 82 during an implant step of the SADS process. By covering a portion of active regions 82 with blanking layer 80, the high-voltage devices maintain high breakdown voltages. The combination of spacing the field implant away from the active edge (distance 90) and spacing the blanking regions to overlap the active edge (distance 88) serves to increase breakdown voltages for the HV and NVM devices and permits their use in high voltage operations needed for memory program and erase. The amount of overlap for distances 88 and 90 depends on the specific process technology and die size requirements.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A method for fabricating a high voltage device, a low voltage device and a memory device of an integrated circuit, comprising:
   forming a source region and a drain region associated with a gate region for each of a high-voltage (HV) device, a low-voltage (LV) device and a non-volatile memory (NVM) device, the HV, LV and NVM devices each electrically isolated by a field oxide region located adjacent the source and drain regions;
   forming field implant regions under the field oxide regions;
   forming a blanking layer on the field oxide regions and a portion of the source and drain regions associated with the HV and NVM devices;
   depositing a metal layer on the gate regions, the blanking layer and exposed portions of the source and drain regions not covered by the blanking layer; and
   forming metal salicide regions in the gate regions and the exposed portions of the source and drain regions.

2. The method of claim 1, further comprising the field implant regions located a predefined distance from an active edge of the source and drain regions associated with the HV and NVM devices.

3. The method of claim 1, further comprising the field implant regions associated with the HV and NVM devices including a width less than the field oxide regions.

4. The method of claim 1, further comprising the metal salicide regions associated with the HV and NVM devices located a predetermined distance from an active edge of the respective source and drain regions.

5. The method of claim 1, further comprising the metal layer selected from the group consisting of titanium, cobalt, tungsten, platinum, nickel and molybdenum.

6. The method of claim 1, wherein the blanking layer comprises an oxide.

7. The method of claim 1, wherein the blanking layer comprises a nitride.

8. The method of claim 1, wherein forming metal salicide regions comprises:
   annealing the LV, HV and NVM devices to react the metal layer with the gate regions and the exposed source and drain regions; and
   removing the metal layer on the field oxide regions.

9. The method of claim 1, further comprising:
   implanting a dopant in the metal salicide regions; and
   annealing the substrate to reduce resistivity of the metal salicide regions.

10. A method for fabricating a high-voltage device, a low-voltage device and a memory device of an integrated circuit, comprising:
    forming a source region and a drain region associated with a gate region for each of a low-voltage (LV) device, a high-voltage (HV) device and a non-volatile memory (NVM) device, the LV, HV and NVM devices each electrically isolated by a field oxide region;
    forming field implant regions under the field oxide regions, located a first predetermined distance from an active edge of the source and drain regions associated with the HV and NVM devices;
    forming a blanking layer on the field oxide regions and a portion of the source and drain regions associated with the HV and NVM devices;
    depositing a metal layer on the gate regions, the blanking layer and exposed portions of the source and drain regions; and
    forming metal salicide regions in the gate regions and the exposed portions of the source and drain regions, the metal salicide regions located a second predetermined distance from the active edge of the source and drain regions associated with the HV and NVM devices.

11. The method of claim 10, further comprising the field implant regions associated with the HV and NVM devices including a width less than the field oxide regions.

12. The method of claim 10, further comprising the metal layer selected from the group consisting of titanium, cobalt, tungsten, platinum, nickel and molybdenum.

13. The method of claim 10, further comprising the metal layer including a thickness between approximately 100 angstroms and approximately 500 angstroms.

14. The method of claim 10, wherein the blanking layer comprises an oxide.

15. The method of claim 10, wherein the blanking layer comprises a nitride.

16. The method of claim 10, wherein forming metal salicide regions comprises:
    annealing the LV, HV and NVM devices to react the metal layer with the gate regions and the exposed source and drain regions; and
    removing the metal layer on the field oxide regions.

17. The method of claim 10, further comprising:
    implanting a dopant in the metal salicide regions; and
    annealing the LV, HV and NVM devices to reduce resistivity in the metal salicide regions.

* * * * *